(12) United States Patent
Zhong et al.

(10) Patent No.: US 9,012,996 B2
(45) Date of Patent: Apr. 21, 2015

(54) SILICON-ON-INSULATOR RADIO-FREQUENCY DEVICE AND METHOD OF FORMING THE SAME

(71) Applicant: Shanghai Huahong Grace Semiconductor Manufacturing Corporation, Shanghai (CN)

(72) Inventors: Zheng Zhong, Shanghai (CN); Le Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/142,200

(22) Filed: Dec. 27, 2013

(65) Prior Publication Data

US 2014/0217503 A1     Aug. 7, 2014

(30) Foreign Application Priority Data

Feb. 1, 2013   (CN) .......................... 2013 1 0041637

(51) Int. Cl.
*H01L 29/06*     (2006.01)
*H01L 21/762*    (2006.01)
*H01L 29/786*    (2006.01)

(52) U.S. Cl.
CPC ...... *H01L 29/0649* (2013.01); *H01L 21/76283* (2013.01); *H01L 29/786* (2013.01)

(58) Field of Classification Search
CPC ..................... H01L 21/76283; H01L 29/0649
USPC .................................. 257/347, 349, 351, 354
See application file for complete search history.

(56) References Cited

U.S. PATENT DOCUMENTS

| 6,429,477 B1 * | 8/2002 | Mandelman et al. ......... 257/301 |
| 8,722,508 B2 * | 5/2014 | Botula et al. ................. 438/422 |
| 2002/0047157 A1 * | 4/2002 | Hidaka et al. ................ 257/347 |

* cited by examiner

*Primary Examiner* — Roy Potter
*Assistant Examiner* — Paul Patton
(74) *Attorney, Agent, or Firm* — Muncy, Geissler, Olds & Lowe, P.C.

(57) ABSTRACT

A silicon-on-insulator (SOI) radio-frequency (RF) device is disclosed, the SOI RF device includes: a silicon substrate; a buried oxide layer formed on the silicon substrate; a device layer formed on the buried oxide layer, the device layer including an RF device; a first dielectric layer covering the device layer; a deep trench structure extending through, from the top downward, the first dielectric layer, the silicon device layer and the buried oxide layer to an interface between the buried oxide layer and the silicon substrate; and a second dielectric layer covering both of the first dielectric layer and the deep trench structure. The SOI RF device is capable of improving signal transmission characteristics and preventing signal distortion, and can be easily manufactured with lower cost in less critical process conditions. A method of forming such an SOI RF device is also disclosed.

2 Claims, 5 Drawing Sheets

SILICON-ON-INSULATOR RADIO-FREQUENCY DEVICE AND METHOD OF FORMING THE SAME

TECHNICAL FIELD

The present invention relates to the semiconductor technology, and more particularly to a silicon-on-insulator (SOI) radio-frequency (RF) device and a method of forming such a device.

BACKGROUND

Silicon-on-insulators (SOIs) are characterized in structure in employing a buried oxide layer between an active layer (or referred to as a device layer, i.e., a silicon layer from which integrated circuit devices are formed) and a substrate to isolate electrical connection between the active layer and the substrate. Primary difference in structure between an SOI circuit and a bulk silicon circuit lies in that, all silicon-based devices of the bulk silicon circuit are formed in an epitaxial layer and the devices are electrically connected to a substrate underlying the epitaxial layer, with reversely biased PN junctions isolating high-voltage and low-voltage portions of the circuit and isolating the active layer and the substrate, whilst in the SOI circuit, an insulator layer (i.e., the buried oxide layer) is employed to accomplish the complete isolation between high-voltage and low-voltage portions of the circuit and between the active layer and the substrate to achieve thorough elimination of electrical connection. Such structural characteristics provide the SOI circuit with a number of advantages, such as reduction in parasitic effect and power consumption and improvement in speed, integration density and noise immunity.

However, the conventional SOI RF devices (i.e., RF devices formed on SOIs) have been found suffering from a problem that the amplification of an RF signal can alter certain electrical characteristics of the substrate and the alteration will in turn cause distortion in the RF signal. We have invented an SOI RF device and a method of forming such an SOI RF device, capable of suppress the drawbacks of the conventional SOI RF devices.

SUMMARY OF THE INVENTION

As noted above, an objective of the present invention is to provide an SOI RF device to solve the problem of the SOI RF devices of the prior art where the amplification of an RF signal can alter certain electrical characteristics of the substrate and the alteration will in turn cause distortion in the RF signal and to suppress their drawbacks of critical manufacturing conditions, high cost and unsuitability for mass production.

Another objective of the present invention is to provide a method of forming an SOI RF device also for solving the above described problem and drawbacks of the prior art devices.

The foregoing objectives are attained by an SOI RF device including: a silicon substrate; a buried oxide layer formed on the silicon substrate; a device layer formed on the buried oxide layer, the device layer including an RF device; a first dielectric layer covering the device layer; a deep trench structure extending through, from the top downward, the first dielectric layer, the device layer and the buried oxide layer to an interface between the buried oxide layer and the silicon substrate; and a second dielectric layer covering both of the first dielectric layer and the deep trench structure.

Optionally, the deep trench structure may be a column.

Optionally, the deep trench structure may be a U-shaped trench.

Optionally, the deep trench structure may include a plurality of spaced stripes, and a number of the plurality of spaced stripes may be five.

Optionally, the deep trench structure may have a transverse dimension of 15 µm to 120 µm.

Optionally, the deep trench structure may include polysilicon.

Optionally, the device layer may further include a shallow trench isolation structure for isolating the RF device from the deep trench structure.

Optionally, the RF device may include a P-type well, a first N-type doped region on a first side of the P-type well, a second N-type doped region on a second side of the P-type well and a polysilicon gate structure on the P-type well.

The foregoing objectives are also attained by a method of forming an SOI RF device, including the steps of:
providing a silicon substrate;
forming a buried oxide layer on the silicon substrate;
forming a device layer on the buried oxide layer, the device layer including an RF device;
forming a first dielectric layer covering the device layer;
forming a deep trench structure extending through, from the top downward, the first dielectric layer, the device layer and the buried oxide layer to an interface between the buried oxide layer and the silicon substrate; and
forming a second dielectric layer covering both of the first dielectric layer and the deep trench structure.

Optionally, forming the deep trench structure may further include the steps of: etching the first dielectric layer, the device layer and the buried oxide layer until an interface between the buried oxide layer and the silicon substrate is reached to form a deep trench; and filling polysilicon in the deep trench to form the deep trench structure.

From the above description, it can be understood that the SOI RF device of this invention is capable of improving signal transmission characteristics and preventing signal distortion, and can be easily manufactured with lower cost in less critical process conditions.

DETAILED DESCRIPTION OF THE INVENTION

Principles, features, objectives and advantages of the invention will be recognized in the following more detailed description which refers to the accompanying drawings.

Figure 1:
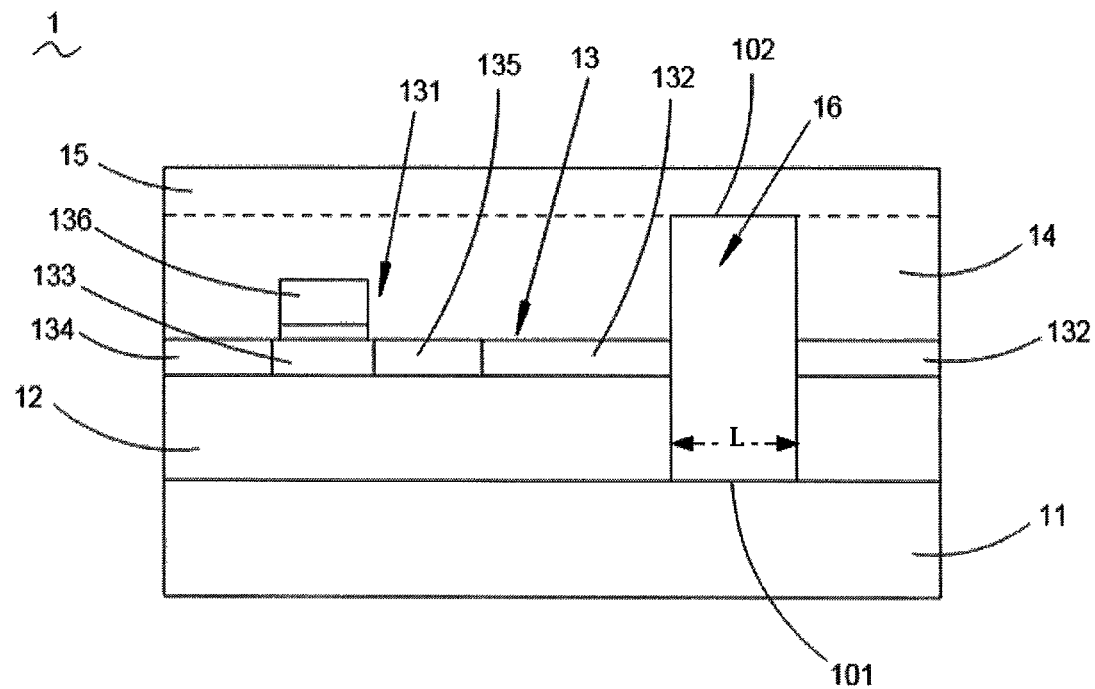
FIGS. 1 to 3 are schematic illustrations of SOI RF devices with different types of deep trench structures constructed in accordance with the present invention.

In FIG. 1, schematically illustrated is a silicon-on-insulator (SOI) radio-frequency (RF) device, designated by the reference number 1, constructed in accordance with the present invention. The SOI RF device 1 includes a silicon substrate 11 for supporting the rest of the SOI RF device 1 and a buried oxide layer 12 formed on the silicon substrate 11. The SOI RF device 1 further includes a device layer 13, which is a silicon layer formed on the buried oxide layer 12. As such, the device layer 13 is isolated by the buried oxide layer 12 from the silicon substrate 11. The device layer 13 may include a device region 131 and a shallow trench isolation structure 132 for device isolation. The SOI RF device 1 further includes: a first dielectric layer 14 covering the device layer 13; a second dielectric layer 15 covering the first dielectric layer 14; and a deep trench structure 16 extending through, from the top downward, the first dielectric layer 14, the device layer 13 and the buried oxide layer 12.

The device region 131 of the device layer 13 includes a P-type well 133, a first N-type doped region 134 on one side of the P-type well 133, a second N-type doped region 135 on the other side of the P-type well 133, and a polysilicon gate structure 136 on the P-type well 133. In one specific embodiment, the deep trench structure 16 is a column vertically extending, from the bottom upward, from an interface 101 between the buried oxide layer 12 and the silicon substrate 11 to an interface 102 between the first dielectric layer 14 and the second dielectric layer 15. In a preferred embodiment, the deep trench structure 16 has a transverse dimension L of 15 µm to 120 µm.

Figure 2:
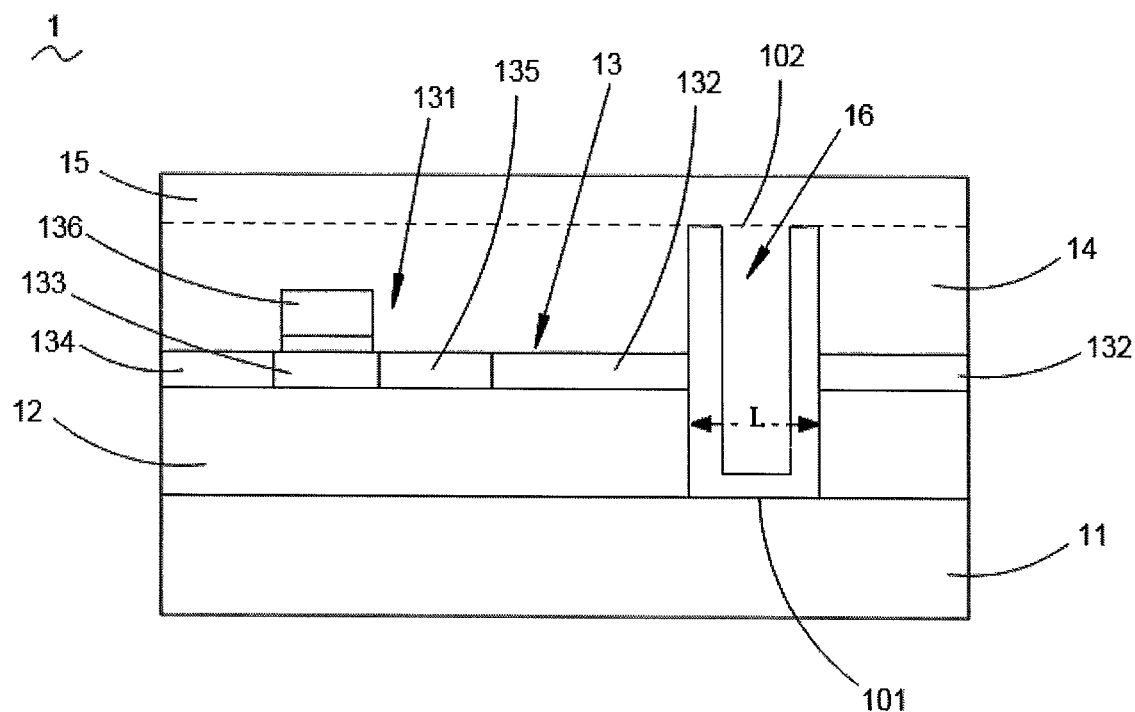
Figure 3:
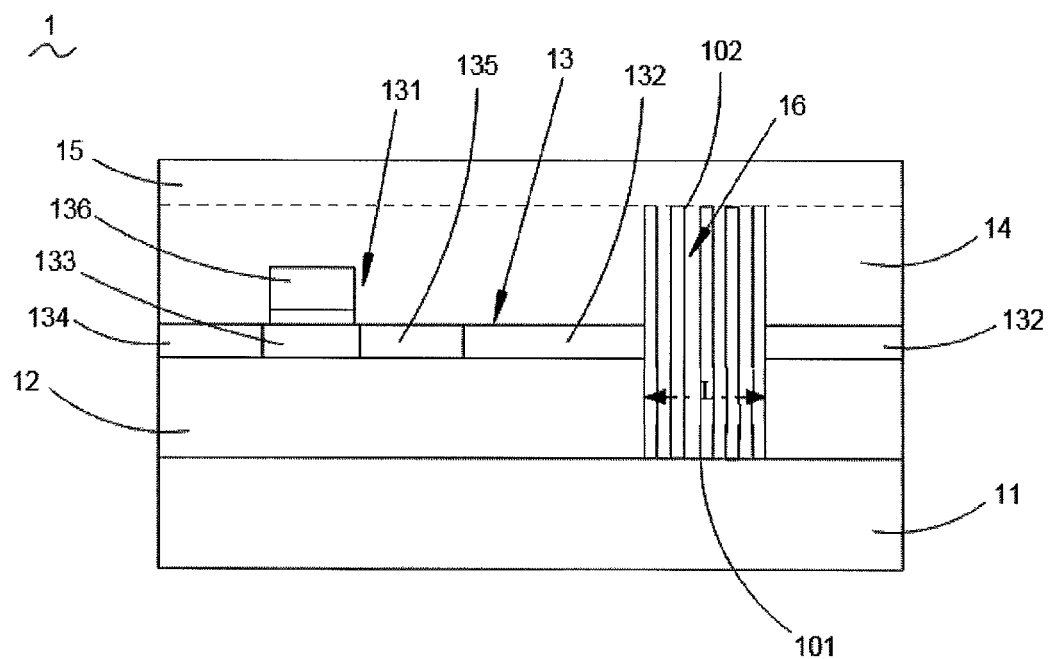

One of skill in the art will understand that the deep trench structure may have any other suitable shape, for example, the deep trench structure may be a U-shaped trench as shown in FIG. 2, or the deep trench structure may include a plurality of parallel arranged and equally spaced stripes as shown in FIG. 3. No matter how the shape the deep trench structure may have, the transverse dimension L is preferred to be 15 µm to 120 µm.

Figure 4:
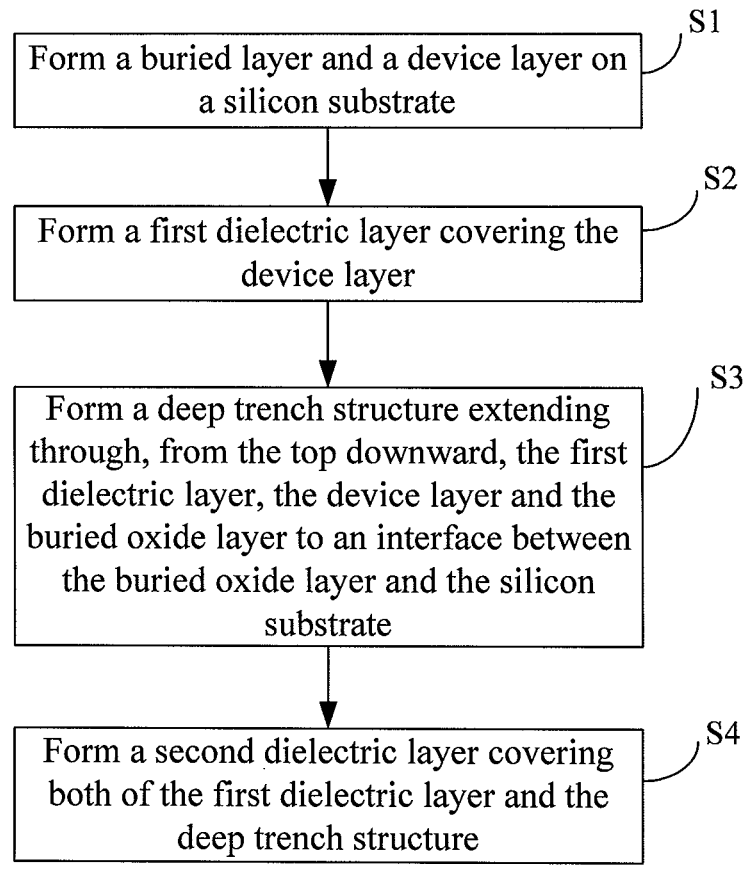
FIG. 4 depicts a flowchart graphically illustrating a method of forming an SOI RF device in accordance with the present invention.

FIG. 4 depicts a flowchart of a method of forming such an SOI RF device in accordance with the present invention, while FIGS. 5 to 9 are schematic illustrations showing the steps of the method. The method includes the four steps S1 to S4 described in detail below, and by way of example, and not by way of limitation, in the context of the deep trench structure 16 being a column (i.e., the SOI RF device 1 shown in FIG. 1).

Figure 5:
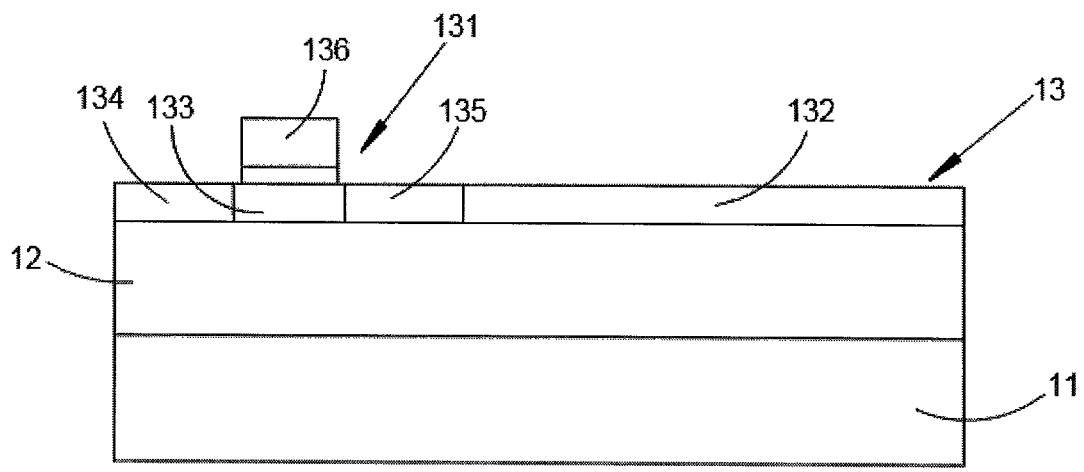
FIGS. 5 to 9 show the steps of the method of FIG. 4.

Turning now to FIG. 5, in step S1, a buried layer 12 and a device layer 13 are sequentially formed on a silicon substrate 11.

Specifically, step S1 may further include the steps of
1) providing the silicon substrate 11 which is configured to support the rest of the SOI RF device 1;
2) forming the buried layer 12 on the silicon substrate 11; and
3) forming a device layer 13 on the buried layer 12, wherein the device layer 13 is a silicon layer and includes a device region 131 and a shallow trench isolation (STI) structure 132 for device isolation.

Additionally, the device region 131 of the device layer 13 includes a P-type well 133, a first N-type doped region 134 on one side of the P-type well 133, a second N-type doped region 135 on the other side of the P-type well 133, and a polysilicon gate structure 136 on the P-type well 133.

Figure 6:
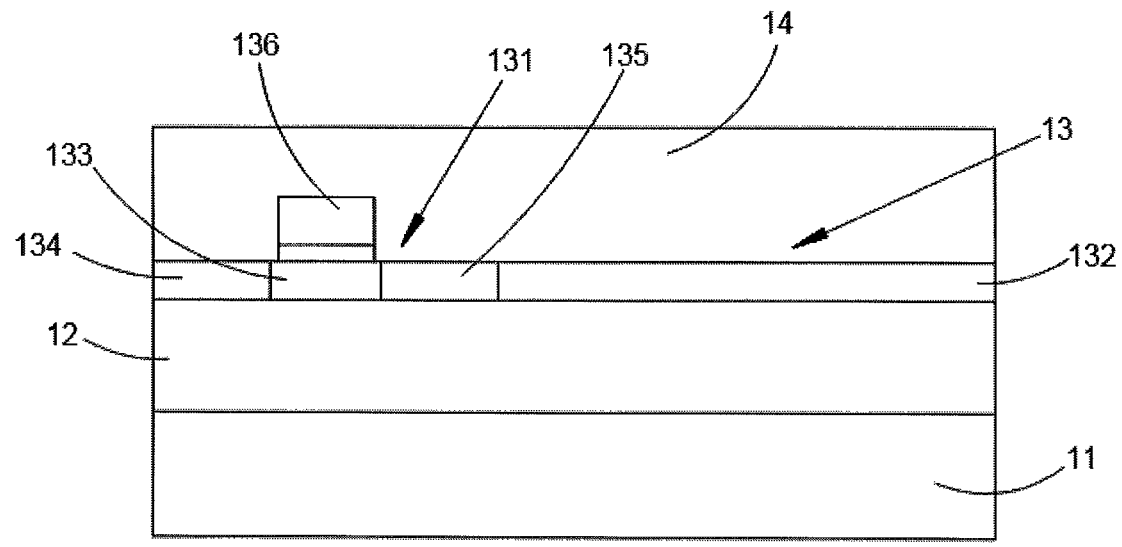

In step S2, referring to FIG. 6, a first dielectric layer 14 is formed covering the device layer 13.

In step S3, a deep trench structure 16 is formed through, from the top downward, the first dielectric layer 14, the device layer 13 and the buried oxide layer 12 to an interface 101 between the buried oxide layer 12 and the silicon substrate 11.

Figure 7:
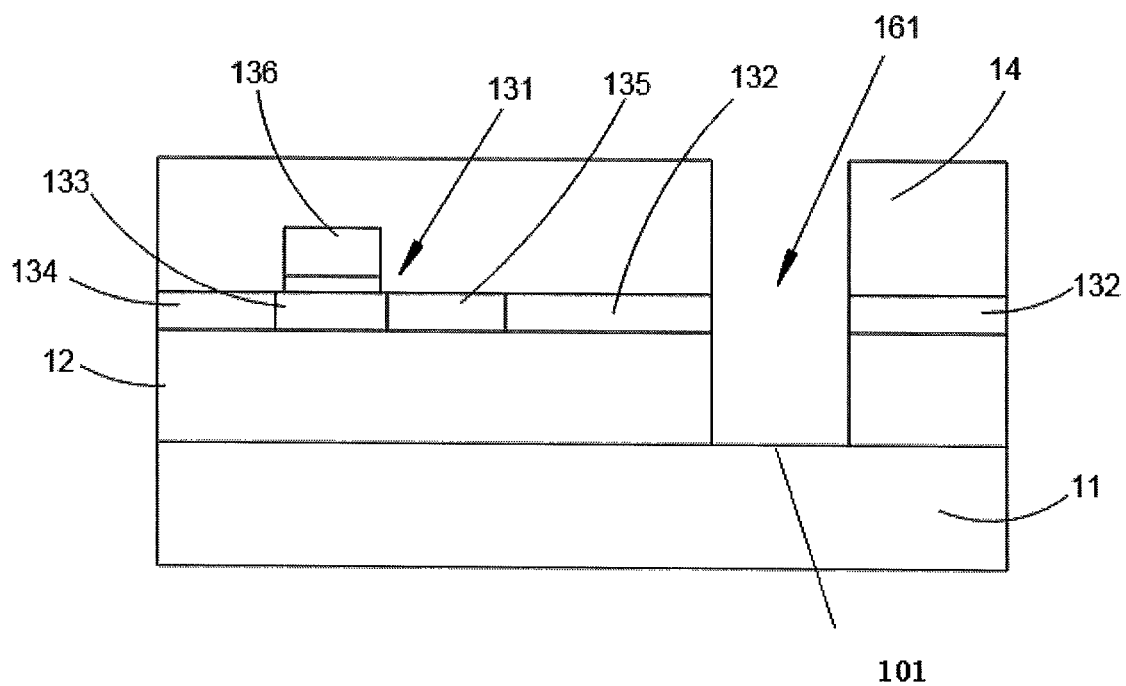
Figure 8:
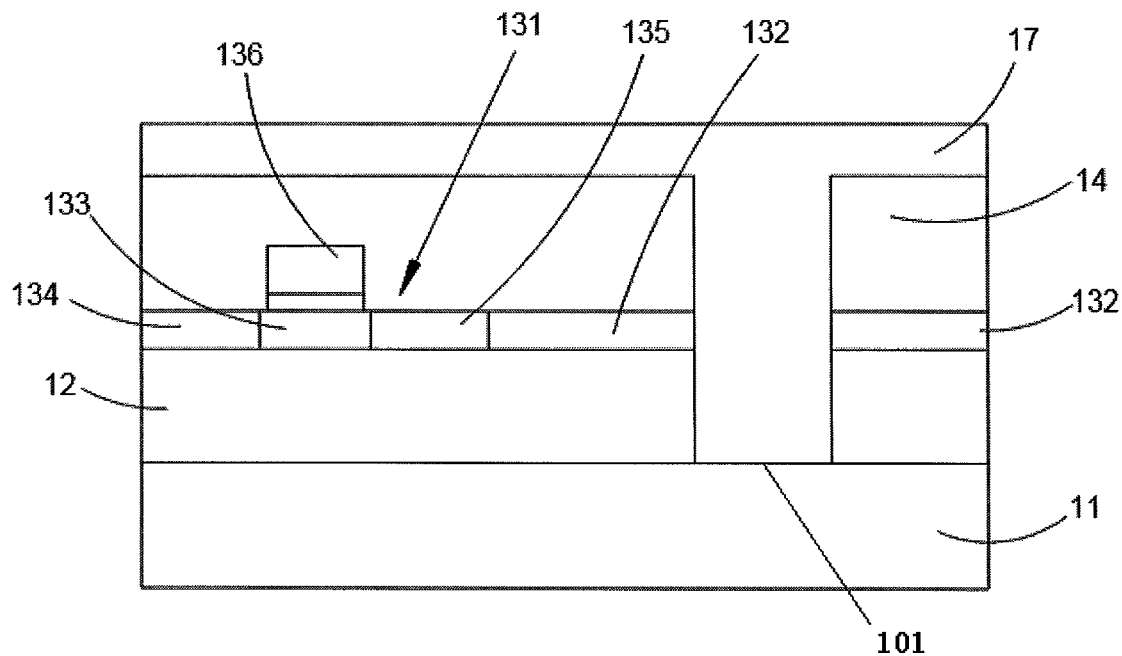
Figure 9:
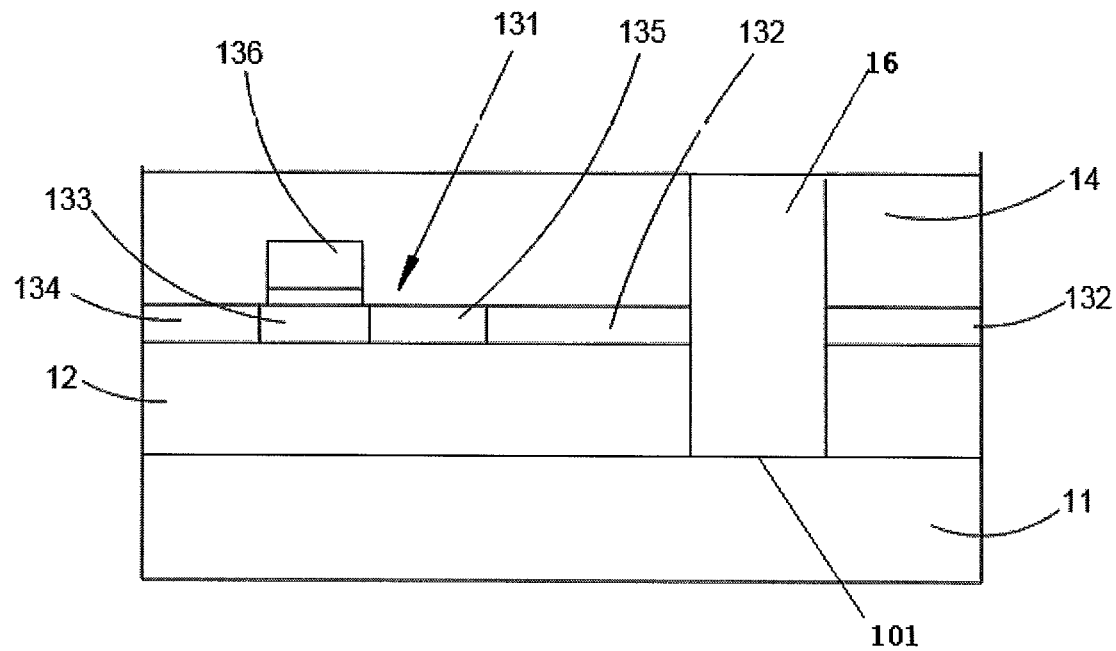

Specifically, forming the deep trench structure 16 may further include the steps of:
1) performing photolithography and etching processes to form a deep trench 161, as shown in FIG. 7, extending through the first dielectric layer 14, the device layer 13 and the buried oxide layer 12 and reaching an interface 101 between the buried oxide layer 12 and the silicon substrate 11; in this embodiment, the deep trench 161 is formed through the STI structure 132 of the device layer 13;

2) filling polysilicon 17 in the deep trench 161, as shown in FIG. 8, until the deep trench 161 is completely filled with polysilicon; in this step, a portion of the polysilicon 17 is also deposited over the first dielectric layer 14; and 3) etching away the undesirable portion of the polysilicon 17 above the first dielectric layer 14, as shown in FIG. 9, to form the deep trench structure 16; as the deep trench structure 16 is surrounded by the STI structure 132, it is electrically isolated from the device region 131.

In step S4, a second dielectric layer 15 is formed, covering the first dielectric layer 14 and the deep trench structure 16, to result in the SOI RF device 1 shown in FIG. 1.

As described above, in one specific embodiment, the deep trench structure 16 is a column vertically extending, from the bottom upward, from an interface 101 between the buried oxide layer 12 and the silicon substrate 11 to an interface 102 between the first dielectric layer 14 and the second dielectric layer 15, and is preferred to have a transverse dimension L of 15 µm to 120 µm.

One of skill in the art will understand that the deep trench structure may have any other suitable shape, for example, the deep trench structure may be a U-shaped trench as shown in FIG. 2, or the deep trench structure may include a plurality of parallel arranged and equally spaced stripes as shown in FIG. 3, and no matter how the shape the deep trench structure may have, the transverse dimension L is preferred to be 15 µm to 120 µm. Deep trench structures of such shapes can be formed by designing corresponding patterns and performing the photolithography and etching processes in step S3 according to the patterns. This can be achieved using conventional techniques well known to those of ordinary skill in the art and, therefore, needs not be described in further detail herein. Further, in the case of the deep trench structure including a plurality of stripes, although five stripes are illustrated in FIG. 3, it should be appreciated that it is within the scope of the present invention for the deep trench structure to have any number of stripes.

In conclusion, the SOI RF device of this invention is capable of improving signal transmission characteristics and preventing signal distortion, and can be easily manufactured with lower cost in less critical process conditions.

It will be understood by those skilled in the art that various changes and modifications can be made therein without departing from the scope of the invention and these are therefore considered to be within the scope of the invention as defined in the appended claims, along with the full scope of equivalents to which such claims are entitled.

What is claimed is:
1. A method of forming a silicon-on-insulator (SOI) radio-frequency (RF) device, comprising the following steps in the sequence set forth:
   providing a silicon substrate;
   forming a buried oxide layer on the silicon substrate;
   forming a device layer on the buried oxide layer, the device layer comprising an RF device;
   forming a first dielectric layer covering the device layer;
   forming a deep trench structure extending through, from the top downward, the first dielectric layer, the device layer and the buried oxide layer to an interface between the buried oxide layer and the silicon substrate; and
   forming a second dielectric layer covering both of the first dielectric layer and the deep trench structure,
   wherein forming the deep trench structure includes the steps of:

etching the first dielectric layer, the device layer and the buried oxide layer until the interface between the buried oxide layer and the silicon substrate is reached to form a deep trench;

filling polysilicon in the deep trench until the deep trench is completely filled with the polysilicon and a portion of the polysilicon is deposited over the first dielectric layer; and etching away the portion of the polysilicon over the first dielectric layer to form the deep trench structure such that a top surface of the deep trench structure is level with a top surface of the first dielectric layer.

2. The method of claim 1, wherein the deep trench structure has a transverse dimension of 15 μm to 120 μm.

\* \* \* \* \*